United States Patent
Oikawa

(10) Patent No.: US 10,798,838 B2
(45) Date of Patent: Oct. 6, 2020

(54) RESIN MOLDED PRODUCT, ELECTRONIC DEVICE, MOLD, METHOD FOR MANUFACTURING MOLD AND METHOD FOR MANUFACTURING RESIN MOLDED PRODUCT

(71) Applicant: CANON KABUSHIKI KAISHA, Tokyo (JP)

(72) Inventor: Kei Oikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 570 days.

(21) Appl. No.: 15/683,536

(22) Filed: Aug. 22, 2017

(65) Prior Publication Data

US 2018/0063979 A1 Mar. 1, 2018

(30) Foreign Application Priority Data

Aug. 25, 2016 (JP) .................. 2016-164832

(51) Int. Cl.
| | |
|---|---|
| *H05K 5/02* | (2006.01) |
| *B29C 33/38* | (2006.01) |
| *G03B 17/02* | (2006.01) |
| *B29C 45/37* | (2006.01) |
| *B29L 31/34* | (2006.01) |

(52) U.S. Cl.
CPC ....... *H05K 5/0243* (2013.01); *B29C 33/3842* (2013.01); *B29C 45/372* (2013.01); *G03B 17/02* (2013.01); *B29C 2945/761* (2013.01); *B29C 2945/7616* (2013.01); *B29C 2945/7626* (2013.01); *B29C 2945/7629* (2013.01); *B29L 2031/3481* (2013.01); *G03B 2217/002* (2013.01)

(58) Field of Classification Search
CPC .................................................. H05K 5/0243
See application file for complete search history.

(56) References Cited

U.S. PATENT DOCUMENTS

| 10,495,788 B2 * | 12/2019 | Shima | .................. B29C 45/0005 |
| 2013/0342977 A1 * | 12/2013 | Chang | .................. B29C 37/0032 |
| | | | 361/679.01 |

FOREIGN PATENT DOCUMENTS

| CN | 101855950 A | 10/2010 |
| CN | 102009329 A | 4/2011 |
| CN | 103052480 A | 4/2013 |
| CN | 103716426 A | 4/2014 |
| JP | 10-71677 A | 3/1998 |
| KR | 10-2011-0068435 A | 6/2011 |

* cited by examiner

*Primary Examiner* — David Sample

(74) *Attorney, Agent, or Firm* — Canon U.S.A., Inc. IP Division

(57) ABSTRACT

There is provided a resin molded product including a hairline pattern having small roughness and high gloss. The resin molded product includes a surface having a hairline pattern in which a plurality of ridges extending in an X direction is arranged in a Y direction, thus the plurality of ridges includes a plurality of first ridges and a plurality of second ridges higher than the first ridges, with the hairline pattern having a maximum height Ry of 6 [μm] or less in the X direction, and an arithmetic average curvature Spc of apex points of 625 [1/mm] or less.

7 Claims, 16 Drawing Sheets

FIG.9

| | SECOND RIDGES ARE FORMED | SECOND RIDGES EXHIBIT 1/f TYPE | ΔT21 [μm] | GLOSS [GU] | MAXIMUM HEIGHT Ry [μm] | ARITHMETIC AVERAGE CURVATURE OF APEX POINTS Spc [1/mm] | EVALUATION |
|---|---|---|---|---|---|---|---|
| EXAMPLE 1 | ○ | ○ | 3 | — | — | — | ○ |
| EXAMPLE 2 | ○ | ○ | 5 | — | — | — | ◎ |
| EXAMPLE 3 | ○ | ○ | 35 | — | — | — | ◎ |
| EXAMPLE 4 | ○ | ○ | 50 | — | — | — | ◎ |
| EXAMPLE 5 | ○ | ○ | 53 | — | — | — | ○ |
| EXAMPLE 6 | ○ | ○ | 35 | 8 | 6 | 625 | ○ |
| EXAMPLE 7 | ○ | ○ | 35 | 10 | 5 | 500 | ◎ |
| EXAMPLE 8 | ○ | ○ | 35 | 26 | 2.6 | 375 | ◎ |
| COMPARATIVE EXAMPLE 1 | × | — | — | 7 | 7.05 | 1375 | × |

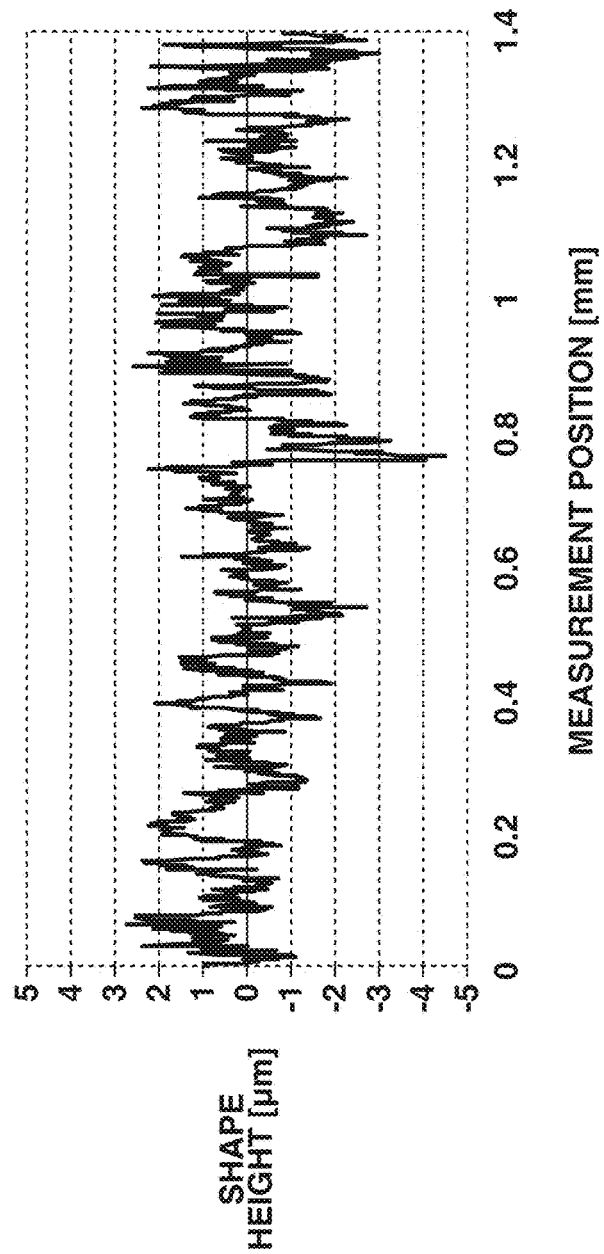

RESIN MOLDED PRODUCT, ELECTRONIC DEVICE, MOLD, METHOD FOR MANUFACTURING MOLD AND METHOD FOR MANUFACTURING RESIN MOLDED PRODUCT

BACKGROUND

Field of the Disclosure

The present disclosure relates to a resin molded product having a hairline pattern, an electronic device having an exterior member including the resin molded product, a mold used to manufacture the resin molded product, a method for manufacturing the mold, and a method for manufacturing the resin molded product.

Description of the Related Art

In recent years, a hairline pattern has been formed on a surface of an exterior member made of a resin molded product to enhance the design of electronic device. The hairline pattern presents high-class feeling to the exterior member of the electronic device. Generally, as a method for forming a hairline pattern on a resin molded product, a method of adding a hairline shape on a mold by chemical etching, and transferring the hairline shape to the resin molded product is known.

For the chemical etching, an etching sheet having the same shape as the hairline pattern is produced in advance. Next, the etching sheet is manually attached to the mold and cured, the mold with the etching sheet attached thereon is then immersed in etching liquid, thereby chemically dissolving the surface of the mold to form a hairline shape.

There is also known a method for manufacturing a mold with a hairline pattern formed without using chemical etching by forming many microscopic grooves by rubbing with sandpaper or a metal brush on a surface of a mold (Japanese Patent Application Laid-Open No. 10-71677).

However, in the method of using chemical etching, the chemical dissolution of a surface of a mold causes concave and convex in the hairline extending direction in a hairline shape on the surface of the mold. Even in the method of using sandpaper or a metal brush, concave and convex in the hairline extending direction is caused in the hairline shape on the surface of the mold. Therefore, rough hairlines have been formed on a surface of a resin molded product produced by using these molds. In addition, hairlines formed on a resin molded product using such molds causes large amount of irregular deflection of light, and thus reduces glossiness.

SUMMARY

The present disclosure is directed to a resin molded product having a hairline pattern having small roughness and high glossiness, electronic device having an exterior member made of the resin molded product, a mold used to manufacture the resin molded product, a method for manufacturing the mold, and a method for manufacturing the resin molded product.

According to an aspect of the present disclosure, a resin molded product includes a surface having a hairline pattern in which a plurality of ridges extending in one direction is arranged in a width direction orthogonal to the one direction, wherein the plurality of ridges include a plurality of first ridges and a plurality of second ridges higher than the first ridges, and wherein the hairline pattern has a maximum height Ry of 6 [μm] or less in the one direction, and has an arithmetic average curvature Spc of apex points of 625 [1/mm] or lower.

According to another aspect of the present disclosure, a method for manufacturing a mold that forms a plurality of concave portions extending in one direction arranged in a width direction orthogonal to the one direction by causing a tip of a cutting tool to cut into a surface of a mold material while rotating the cutting tool and moving the cutting tool in the one direction, the method includes forming a plurality of first concave portions of the plurality of concave portions to have a first cutting depth with reference to the surface, and forming a plurality of second concave portions of the plurality of concave portions to have a second cutting depth with reference to the surface, the second cutting depth being larger than the first cutting depth.

According to the present disclosure, roughness of a surface of the resin molded product is reduced, and glossiness of the surface of the resin molded product is increased.

Further features of the present disclosure will become apparent from the following description of exemplary embodiments with reference to the attached drawings.

BRIEF DESCRIPTION OF THE DRAWINGS

FIG. 9 illustrates an evaluation result of resin molded products.

FIG. 15 is a graph illustrating shape data in the X direction of the hairline pattern of the resin molded product according to the comparative example 1.

DESCRIPTION OF THE EMBODIMENTS

Figure 1:
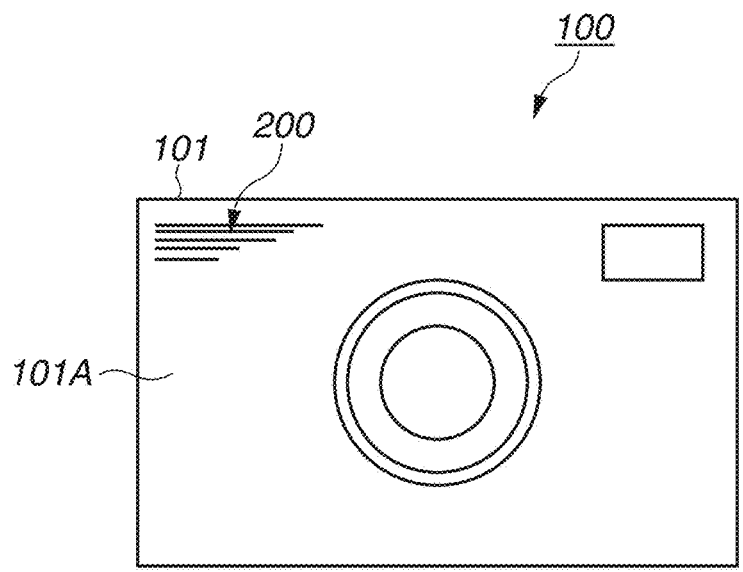
FIG. 1 is a diagram illustrating a schematic structure of an electronic device according to an exemplary embodiment.

Hereinafter, an exemplary embodiment of the present disclosure will be described in detail with reference to the drawings. FIG. 1 is a diagram illustrating a schematic structure of an electronic device according to the present exemplary embodiment. An electronic device 100 is an electronic device such as a camera, a printer, or other electronic devices. FIG. 1 illustrates a camera as an example of the electronic device 100. The electronic device 100 includes an exterior member 101 made of a resin molded product, and is provided with electronic parts (not illustrated) inside the exterior member 101. A hairline pattern 200 is formed on an outer surface 101A of the exterior member 101.

Figure 2:
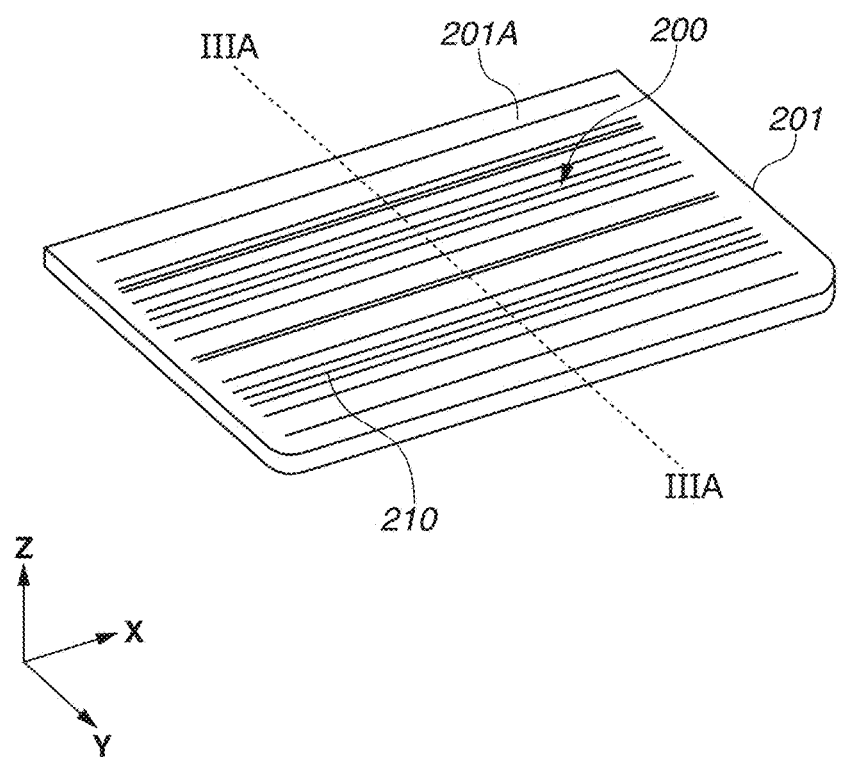
FIG. 2 is a perspective view of a resin molded product illustrating a part of an exterior member illustrated in FIG. 1.

FIG. 2 is a perspective view of a resin molded product illustrating a part of the exterior member illustrated in FIG. 1. A resin molded product 201 illustrated in FIG. 2, which is a part of the exterior member 101, is made of a thermoplastic resin (e.g., acrylonitrile butadiene styrene (ABS) resin). In the resin molded product 201, a hairline pattern 200 is formed on a surface 201A, which is the outer surface 101A of the exterior member 101 illustrated in FIG. 1. The hairline pattern 200 has a plurality of hairlines 210 extending in one direction (X direction).

Figure 3A:
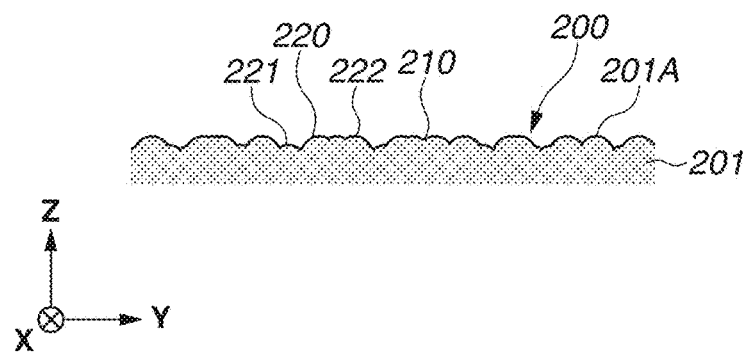
FIGS. 3A and 3B are each cross-sectional views of the resin molded product taken along line IIIA-IIIA of FIG. 2, and a plan view of a hairline pattern of the resin molded product according to the exemplary embodiment, respectively illustrated in FIG. 1.
Figure 3B:
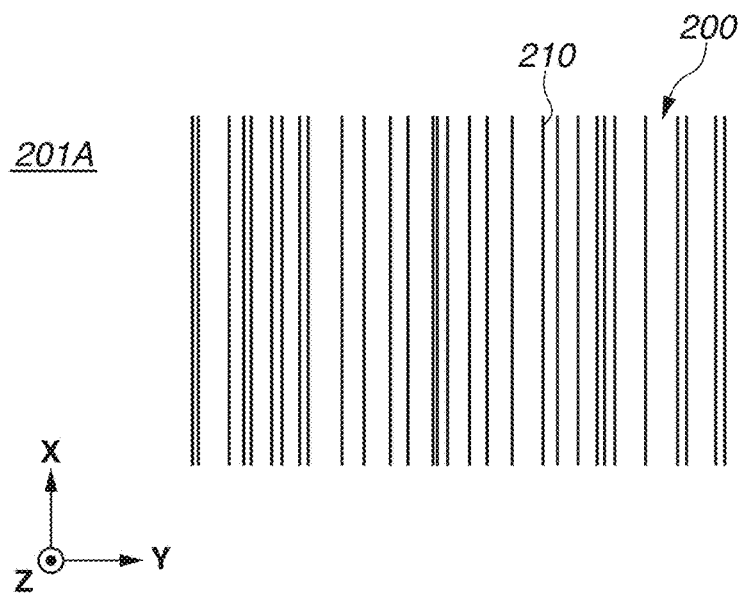

FIG. 3A is a cross-sectional view of the resin molded product taken along line IIIA-IIIA of FIG. 2. The line IIIA-IIIA in FIG. 2 is a line extending in a width direction (Y direction) orthogonal to an X direction, in which the hairlines extend. FIG. 3B is a plan view of the hairline pattern of the resin molded product according to the present exemplary embodiment.

As illustrated in FIG. 3A, the hairline pattern 200 on the surface 201A of the resin molded product 201 is formed so that a plurality of ridges 220 that extends in the X direction and is arranged in the Y direction orthogonal to the X direction. Boundaries (valleys) between the adjacent ridges 220 are the hairlines 210 illustrated in FIGS. 3A and 3B. A Z direction orthogonal to the X direction and the Y direction is the height direction (depth direction) of the ridges 220.

As illustrated in FIG. 3A, the plurality of ridges 220 includes a plurality of ridges (first ridges) 221 and a plurality of ridges (second ridges) 222 higher than the ridges 221. In other words, the plurality of ridges 220 includes the plurality of ridges 222 and the plurality of ridges 221 lower than the ridges 222.

Figure 4:
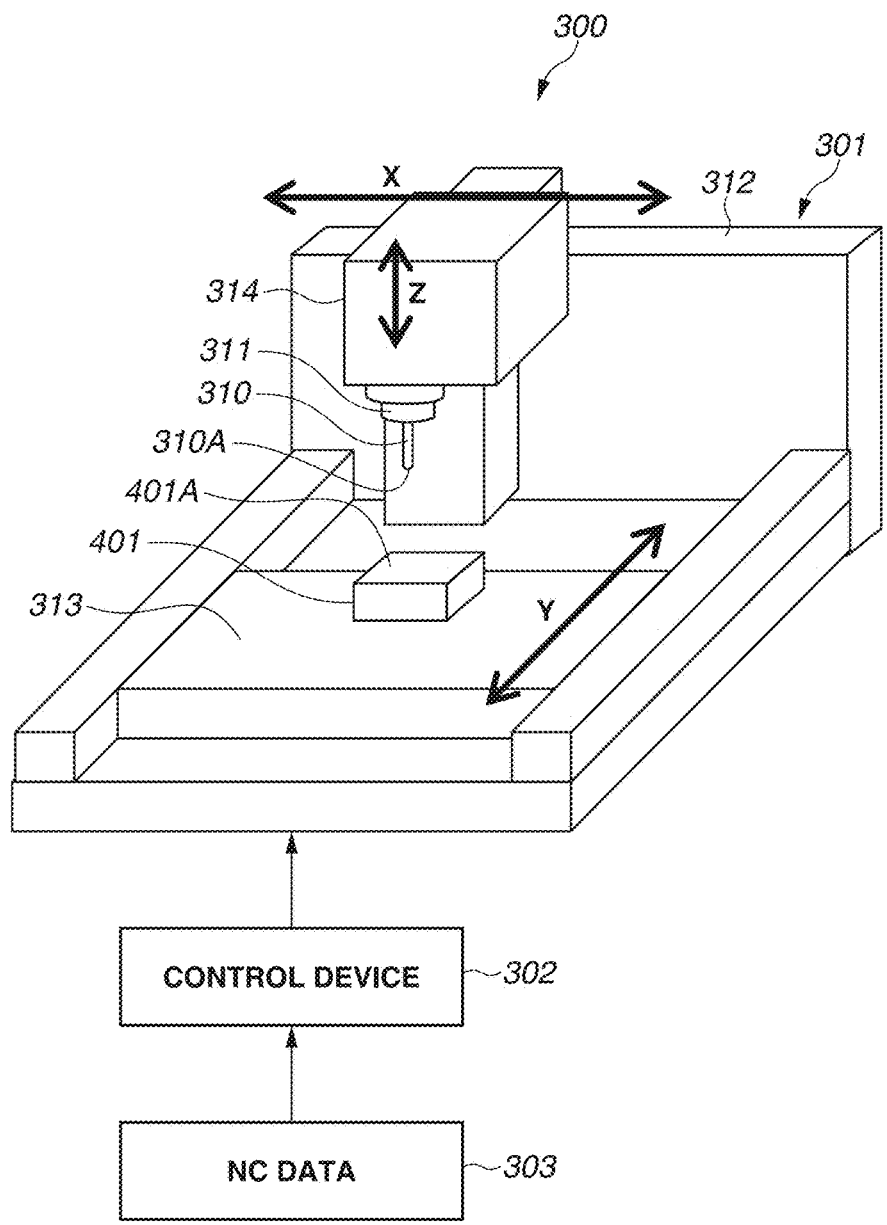
FIG. 4 is a diagram illustrating a machining center to process a mold according to the exemplary embodiment illustrated in FIG. 1.

The resin molded product 201 is molded by injecting a thermoplastic resin into a mold and filling the mold with the thermoplastic resin. The mold has a cavity piece having a hairline pattern forming portion. FIG. 4 is a diagram illustrating a machining center that processes the mold according to the exemplary embodiment. The machining center 300 includes a machining main body 301 and a control device 302.

The machining main body 301 performs cutting work to a surface 401A of a mold material 401, which is to be machined, to manufacture a cavity piece that is one of components of the mold. The machining main body 301 has a spindle 311, which is a main shaft for supporting a cutting tool 310, an X stage 312, a Y stage 313, and a Z stage 314.

The cutting tool 310 is preferably an end mill. In the present exemplary embodiment, the cutting tool 310 is a ball end mill having a spherical tip 310A. The spindle 311 rotates the cutting tool 310 about the Z axis. The Z stage 314 supports the spindle 311 and moves the spindle 311 and then the cutting tool 310 in the Z direction with respect to the mold material 401. The X stage 312 supports the Z stage 314 and moves the Z stage 314 and then the cutting tool 310 in the X direction with respect to the mold material 401. The Y stage 313 supports the mold material 401 and moves the mold material 401 in the Y direction with respect to the cutting tool 310.

Therefore, while rotating the cutting tool 310, the machining main body 301 can move the tip 310A of the cutting tool 310 relative to the surface 401A of the mold material 401 in the XYZ directions.

The control device 302 includes a computer having a central processing unit (CPU) and a memory, and controls the machining main body 301 according to numerical control (NC) data 303. The NC data 303 includes various commands to be used in cutting such as a movement amount in the X direction, a movement amount in the Y direction, a movement amount in the Z direction, a rotation speed of a main shaft, a feed speed in the X direction, a feed speed in the Y direction, and a moving speed in the Z direction. By moving the cutting tool 310 relative to the surface 401A of the mold material 401 while rotating the cutting tool 310 under the control of the control device 302, it is possible to form a three-dimensional shape based on the NC data 303 on the surface 401A of the mold material 401 by cutting.

Figure 5A:
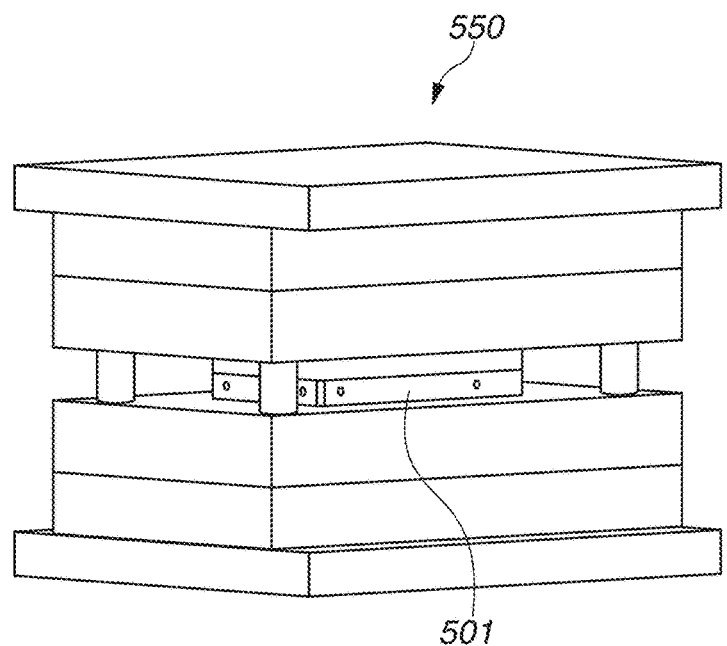
FIGS. 5A and 5B are perspective views illustrating the entire mold and a cavity piece included in the mold, respectively.
Figure 5B:
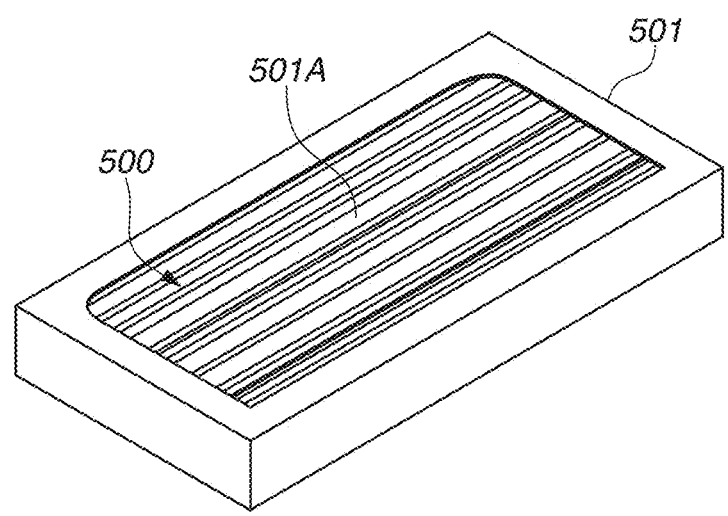

FIG. 5A is a perspective view illustrating the entire mold, and FIG. 5B is a perspective view illustrating a cavity piece included in the mold. In the present exemplary embodiment, a hairline pattern forming portion is not provided on the entire surface of a mold 550 illustrated in FIG. 5A, but a hairline pattern forming portion 500 is provided only on a surface 501A of a cavity piece 501 illustrated in FIG. 5B, which is one of components of the mold 550. The hairline pattern forming portion 500 is formed to have a shape obtained by inverting the hairline pattern 200 to form the hairline pattern 200 on the surface 201A of the resin molded product 201 illustrated in FIG. 2.

Figure 6A:
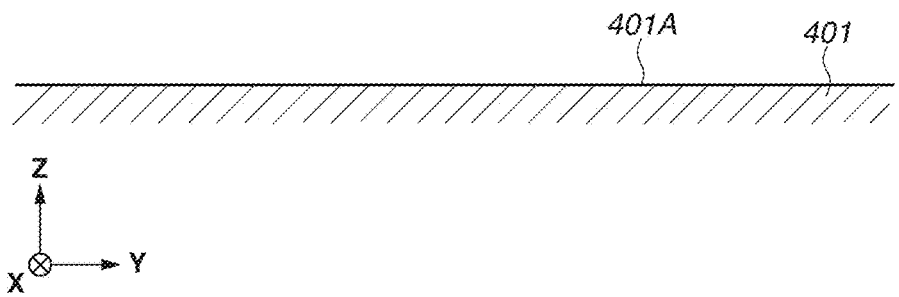
FIGS. 6A to 6C are diagrams illustrating a method for manufacturing the resin molded product according to the exemplary embodiment illustrated in FIG. 1.
Figure 6B:
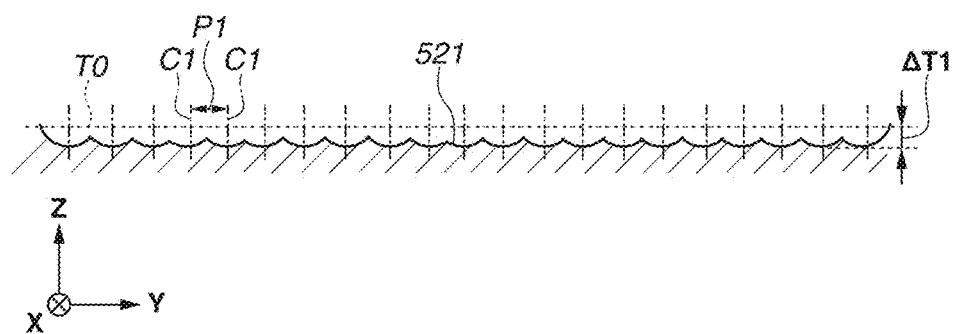
Figure 6C:
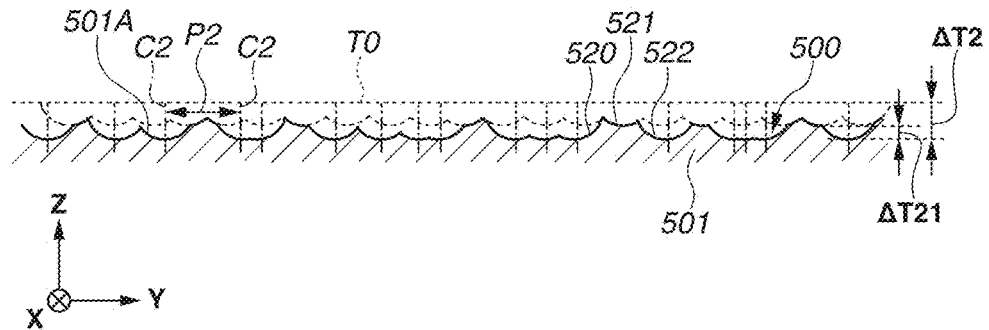
Figure 7A:
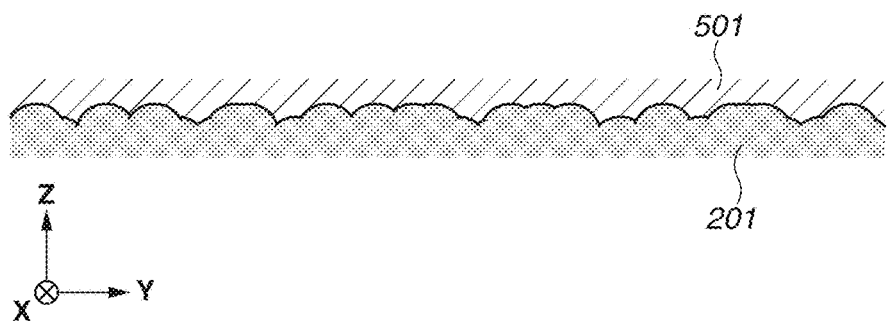
FIGS. 7A to 7C are diagrams illustrating a method for manufacturing the resin molded product according to the present exemplary embodiment illustrated in FIG. 1, respectively.
Figure 7B:
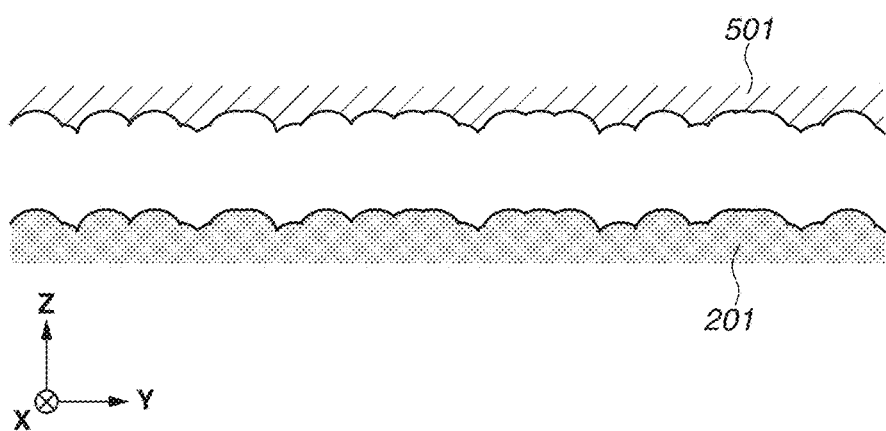
Figure 7C:
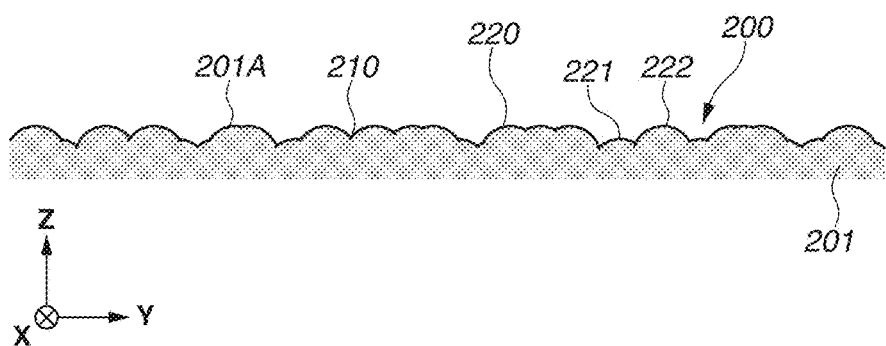

Hereinafter, a method for manufacturing a resin molded product (i.e., a method for manufacturing a mold) will be described. FIGS. 6A to 6C and FIGS. 7A to 7C are diagrams illustrating a method for manufacturing a resin molded product according to the present exemplary embodiment. FIG. 6A illustrates a mold material before cutting. FIG. 6B is a diagram illustrating a first machining step. FIG. 6C is a diagram illustrating a second machining step. FIG. 7A is a diagram illustrating a molding step in which a mold is incorporated in a molding machine and injection molding is performed. FIG. 7B is a diagram illustrating a releasing step of releasing a resin molded product from the mold. FIG. 7C illustrates a resin molded product.

By cutting the surface 401A of the mold material 401 illustrated in FIG. 6A as illustrated in FIGS. 6B and 6C, the cavity piece 501 having a hairline pattern forming portion 500 formed thereon is manufactured. The hairline pattern forming portion 500 has a plurality of concave portions 520 extending in the X direction formed on the surface 501A. The mold material 401 is a mold before cutting. Then, using the mold 550 (FIG. 5A) having the manufactured cavity piece 501, the resin molded product 201 is molded by injection molding (molding step) as illustrated in FIG. 7A. Then, the resin molded product 201 is released from the mold 550 (FIG. 5A) having the cavity piece 501 as illustrated in FIG. 7B, whereby the resin molded product 201 illustrated in FIG. 7C is provided.

Hereinafter, the cutting step in the manufacturing process of the cavity piece 501 of the mold 550 will be described in detail. The cutting step includes a first machining step and a second machining step.

First, the first machining step will be described. The cutting is performed by making the tip 310A of the cutting tool 310 to cut into the surface 401A of the mold material 401 illustrated in FIG. 6A while rotating the cutting tool 310 illustrated in FIG. 4, and moving the cutting tool 310 in the X direction. The cutting in the X direction is performed a plurality of times after shifting the cutting tool 310 in the Y direction. As a result, a plurality of concave portions (first concave portions) 521 extending in the X direction and arranged in the Y direction is formed on the surface 401A as illustrated in FIG. 6B. The concave portions 521 are grooves for forming the ridges 221 (FIG. 7C).

A feed amount (pitch) of the cutting tool 310 in the Y direction with respect to the surface 401A of the mold material 401 in the first machining step is P1. As a result, the interval in the Y direction of center axes C1 extending in the Z direction through valley bottom points of two adjacent concave portions 521 is P1.

At this time, the plurality of concave portions 521 arranged in the Y direction is formed to have the cutting depth (first cutting depth) of $\Delta T1$ with reference to a position T0 of the surface 401A. In other words, respective concave portions 521 are formed to have the same cutting depth $\Delta T1$. The plurality of concave portions 521 is finally formed in the entire region to be the hairline pattern forming portion 500 illustrated in FIG. 6C.

In the present exemplary embodiment, the plurality of concave portions 521 is formed in such a manner that two adjacent concave portions 521 (first concave portions) partially overlap with each other. In other words, the plurality of concave portions 521 is finally formed with no gaps in the entire region to be the hairline pattern forming portion 500 illustrated in FIG. 6C. At this time, it is preferable to form the plurality of concave portions 521 at equal intervals in the Y direction. In other words, it is preferable that the intervals P1 are the same with each other.

Next, the second machining step will be described. As illustrated in FIG. 6C, a plurality of concave portions (second concave portions) 522 that is deeper than the concave portions 521 is formed to have the cutting depth (second cutting depth) of $\Delta T2$ with reference to the position T0 of the surface 401A as illustrated in FIG. 6C. The cutting depth $\Delta T2$ is larger than the cutting depth $\Delta T1$. The concave portions 522 are grooves for forming the ridges 222 (FIG. 7C).

The concave portions 522 are formed through cutting by moving the cutting tool 310, which is also used to form the concave portions 521, in the X direction. The cutting in the X direction is performed a plurality of times while shifting the cutting tool 310 in the Y direction to form the plurality of concave portions 522.

Here, the difference ($\Delta T2 - \Delta T1$) between the cutting depth $\Delta T1$ and the cutting depth $\Delta T2$ is $\Delta T21$. The valley bottom points of the concave portions 522 are deeper than the valley bottom points of the concave portions 521 by the difference $\Delta T21$. Therefore, the apex points of the ridges 222 of the resin molded product 201 to be molded are higher than the apex points of the ridges 221 by the difference $\Delta T21$. In other words, the apex points of the ridges 221 are lower than the apex points of the ridges 222 by the difference $\Delta T21$.

A feed amount (pitch) of the cutting tool 310 in the Y direction with respect to the surface 401A of the mold material 401 in the second machining step is P2. As a result, the interval in the Y direction of center axes C2 extending in the Z direction through valley bottom points of two adjacent concave portions 522 is P2.

In the present exemplary embodiment, the plurality of concave portions 521 is finally formed with no gaps in the entire region to be the hairline pattern forming portion 500 illustrated in FIG. 6C. Thus, the plurality of concave portions 522 is formed on the plurality of concave portions 521 (on the first concave portions) formed in the first machining step.

Therefore, the plurality of concave portions 520 that are finally formed includes the plurality of concave portions 522 and the plurality of concave portions 521 that is left from the cutting to form the concave portions 522. As described above, in the hairline pattern forming portion 500, the plurality of concave portions 520 is formed with no gaps, and thus no underground (the surface 401A of the mold material 401) is left.

The resin molded product 201 is formed (FIG. 7C) by injection molding using the mold 550 having the cavity piece 501 manufactured by the above manufacturing process (FIG. 7A) and releasing the resin molded product 201 (FIG. 7B). As a result, the hairline pattern 200 is formed on the surface 201A of the resin molded product 201 due to the transfer of the hairline pattern forming portion 500.

To this hairline pattern 200, the underground that is the surface of the mold material is not transferred. Therefore, the hairline pattern 200 having a high-class feeling with uniform gloss (reflection) of light is obtained.

The resin molded product 201, on which the hairline pattern 200 is formed by the above-described method, is less rough and has higher gloss than a resin molded product having a hairline pattern formed by the conventional chemical etching method. In the present exemplary embodiment, since the hairline pattern forming portion 500 is formed based on the NC data 303, it is possible to obtain a hairline shape with high accuracy. In addition, since the ball end mill is used as the cutting tool 310 in the present exemplary embodiment, the cutting marks have an arc-shaped cross section as illustrated in FIGS. 6B and 6C. Therefore, as illustrated in FIG. 7C, in the molded resin molded product 201, the ridges 220 (the ridges 221 and the ridges 222) have an arc shape in the cross section in the Y direction.

Figure 8A:
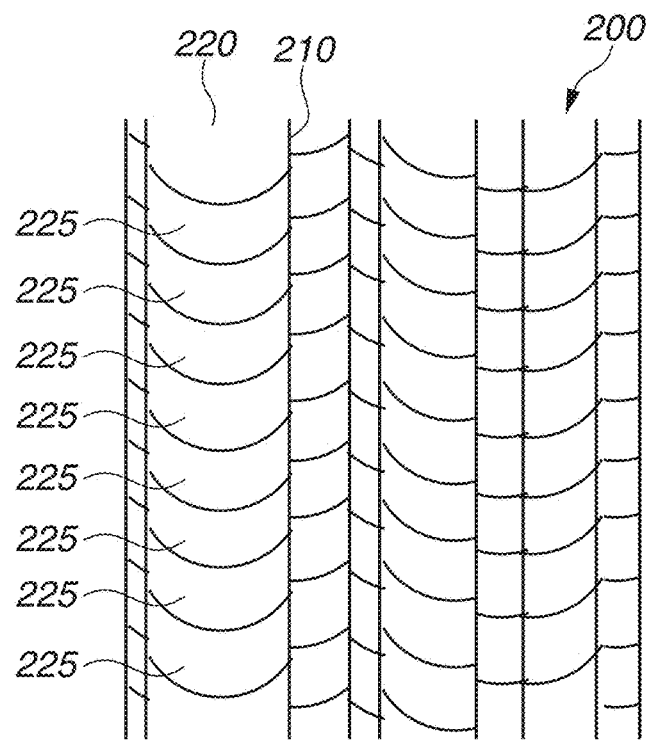
FIGS. 8A and 8B are plan views schematically illustrating the hairline pattern on a surface of the resin molded product, and a graph schematically illustrating a spectral intensity with respect to a spatial frequency according to the exemplary embodiment illustrated in FIG. 1, respectively.

FIG. 8A is a plan view schematically illustrating a hairline pattern on the surface of the resin molded product according to the present exemplary embodiment. As illustrated in FIG. 8A, the ridges 220 (the ridges 221 and the ridges 222) are formed to have a plurality of balls 225 having the same radius of curvature consecutively arranged in the X direction overlapping each other. Generation of heat in cutting to form the concave portions 520 having an arc-shaped cross section and extending in the X direction can be suppressed, and an accurate hairline shape with less burr can be obtained.

In other words, by adjusting the feeding speed in the X direction to suppress heat generation during cutting of the mold, each of the concave portions 520 has a shape in which a plurality of ball surfaces having the same radius of curvature is consecutively arranged in the X direction overlapping each other. This shape is transferred to form the ridges 220 in which the balls 225 are consecutively arranged. As long as the heat generation in the cutting can be suppressed, cutting may be performed to form the concave portions 520 having a cylindrical shape extending in the X direction. In this case, the ridges 220 are formed to have a cylindrical shape extending in the X direction.

In the cutting to form the concave portions 522 in FIG. 6C, the relative feed speed of the cutting tool 310 in the X direction with respect to the mold material 401 is the same as that in the cutting to form the concave portions 521. Therefore, the cutting mark of the concave portions 522 in the X direction is the same as that of the concave portions 521.

Here, the intervals P2 between the plurality of concave portions 522 are not periodic in the Y direction. As a result, in the resin molded product 201 to be molded, the plurality of ridges 222 is formed at intervals that are not periodic in the Y direction. In the present exemplary embodiment, the spectral intensity of the surface roughness in the Y direction of the hairline pattern 200 is inversely proportional to the spatial frequency f, i.e., 1/f type.

Figure 8B:
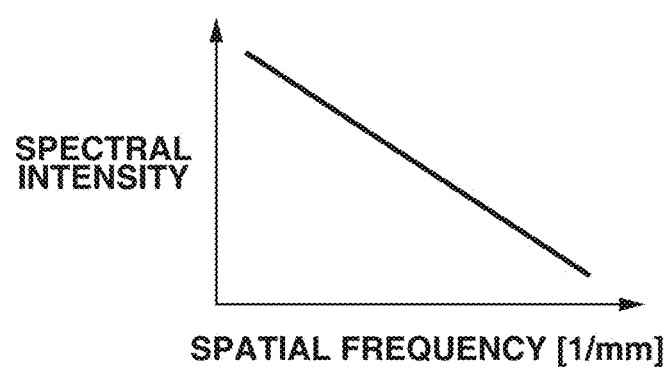

FIG. 8B is a graph schematically illustrating spectral intensity with respect to spatial frequency in the present exemplary embodiment. In FIG. 8B, the horizontal axis represents the spatial frequency [1/mm] and the vertical axis represents the spectral intensity. Both the vertical and horizontal axes are represented by logarithms. By Fourier transforming the surface roughness in the Y direction of the hairline pattern 200, the spectral intensity with respect to the spatial frequency is obtained.

Figure 13A:
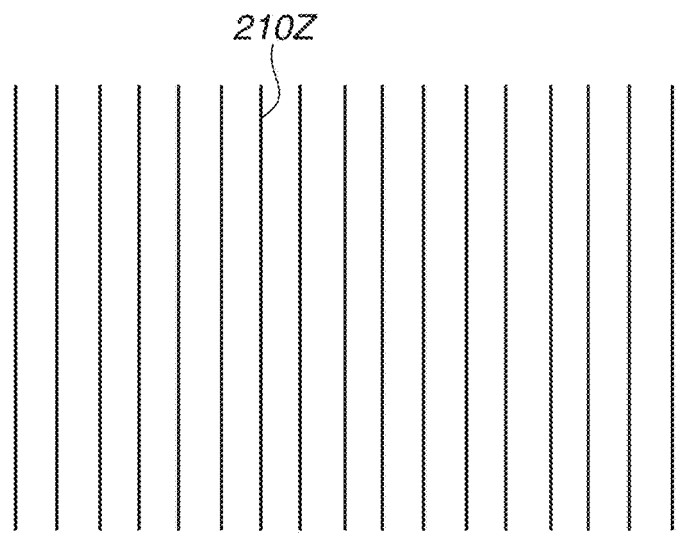
FIGS. 13A and 13B are a plan view schematically illustrating a hairline pattern on a surface of a resin molded product and a graph schematically illustrating a spectral intensity with respect to a spatial frequency according to a reference example, respectively.
Figure 13B:
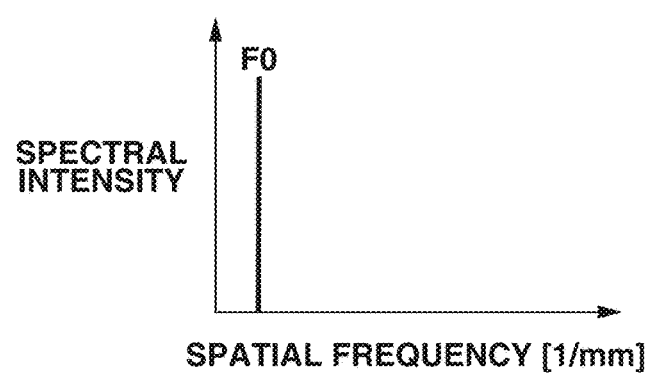

FIG. 13A is a plan view schematically illustrating a hairline pattern on a surface of a resin molded product according to a reference example. FIG. 13B is a graph schematically illustrating spectral intensity with respect to spatial frequency according to the reference example. When a plurality of hairlines 210Z is arranged at equal intervals as illustrated in FIG. 13A, spectral intensities concentrate and a high peak value appears at a certain spatial frequency F0 as illustrated in FIG. 13B. As described above, when the plurality of hairlines 210Z is arranged at equal intervals, periodic components become stronger, which causes artificial feeling and degrades high-class feeling.

In the present exemplary embodiment, as illustrated in FIG. 7B, the spectral intensity monotonically decreases with respect to the spatial frequency, so that the arrangement interval of the ridges 222 exhibits 1/f fluctuation. This 1/f fluctuation eliminates periodicity in the hairlines 210, can make an impression on a user that the surface is not artificial, and further enhances metallic feeling and high-class feeling of the resin molded product 201 and then those of the electronic device 100.

Specific examples will be described below.

Examples 1 to 8

The size of the cavity piece 501 in examples 1 to 8 was set to 200 [mm]×400 [mm]×50 [mm] and the outer shape of the hairline pattern forming portion 500 on which hairline pattern 200 is formed was set to 150 [mm]×350 [mm].

The machining conditions were set as follows. The rotation speed of the main shaft and then that of the cutting tool 310 was set to 20000 [revolution per minute (RPM)], and the feed speed of the cutting tool 310 in the X direction was set to 1000 [mm/min]. The intervals P1 between the valley bottom points of the concave portions 521 were set to 0.2 [mm], and the cutting depth (machining depth) ΔT1 was set to 10 [μm].

In the examples 1 to 8, the intervals P2 between the valley bottom points of the concave portions 522 were adjusted to exhibit 1/f fluctuation. The cutting depth (machining depth) ΔT2 was set to a predetermined value within a range between 13 [μm] and 63 [μm] inclusive. In other words, the difference ΔT21 (=ΔT2−ΔT1) between the cutting depth ΔT1 and the cutting depth ΔT2 was set to a predetermined value within a range between 3 [μm] and 53 [μm] inclusive. These machining conditions are included in the instructions of the NC data 303, and according to the NC data 303 the control device 302 controlled the machining main body 301 to cut the mold material 401.

Injection molding was performed using the mold 550 having the manufactured cavity piece 501 on which the hairlines were formed to obtain the resin molded product 201. The used resin material was ABS resin of Toray Industries, Inc. and the color thereof was black. As the molding machine, J180ELIII injection molding machine (The Japan Steel Works, Ltd.) was used, and molding conditions were set so that the concavo-convex shape formed on the surface 501A of the cavity piece 501 could be sufficiently transferred to the surface 201A of the resin molded product 201.

Comparative Example

The size of the cavity piece according to a comparative example 1 was set to the same size as that in the examples 1 to 8. The machining method was chemical etching. First, a masking sheet having a desired hairline pattern was prepared, the masking sheet was attached to a mold material, and then the mold material was dipped in an etching liquid to selectively dissolve a surface of a mold to manufacture a cavity piece. Then, a resin molded product was molded by injection molding using the same molding machine and the same resin material as used in the examples 1 to 8.

<Evaluation>

FIG. 9 illustrates an evaluation result of the resin molded products. The concavo-convex shapes on the surfaces of the resin molded products according to the examples 1 to 8 and the comparative example 1 were evaluated using a laser microscope VK-X manufactured by Keyence Corporation. The gloss was measured using Handy Gloss Meter PG-1 manufactured by Nippon Denshoku Industries Co., Ltd. Using these measuring instruments, the gloss, the maximum height Ry, and the arithmetic average curvature Spc of the apex points were measured.

The gloss is a value obtained by measuring reflected light from the surface of a sample with respect to measuring light at an incident angle (measuring angle) θ (60°) and expressed within the range of 0 to 1000 gloss unit (GU).

The maximum height Ry is obtained by extracting a part of the roughness curve for a reference length in the X direction, measuring a height Rp from the average line of the extracted part to the highest apex and a depth Rv from the average line to the lowest valley bottom, and adding the height Rp and the depth Rv.

$$Ry = Rp + Rv \qquad \text{Equation (1)}$$

The arithmetic average curvature Spc of the apex points is the average of the principal curvatures of the apex points of the surface, expressed by the inverse number of the radius, and calculated by averaging as Equation (2). Therefore, when this value is small, it indicates that the apex points have roundness and a wide shape, and when it is large, it indicates that the apex points are sharp and have a narrow width shape.

$$Spc = -\frac{1}{2}\frac{1}{n}\sum_{k=1}^{n}\left(\frac{\partial^2 z(x,y)}{\partial x^2} + \frac{\partial^2 z(x,y)}{\partial y^2}\right) \quad \text{Equation (2)}$$

Evaluation was made using the gloss, the maximum height Ry and the arithmetic average curvature Spc of apex points. In addition, quality was evaluated to five levels of "1" to "5" by five experts for appearance determination. The indicated evaluation is higher from "1" toward "5". The evaluation criteria were set in such a manner that a cross means that the average of the evaluation results of five experts is "2" or lower, a circle means that the average of the evaluation results of five experts is "3" to "4", a double-circle means that the evaluation results of five experts are "5".

Figure 14A:
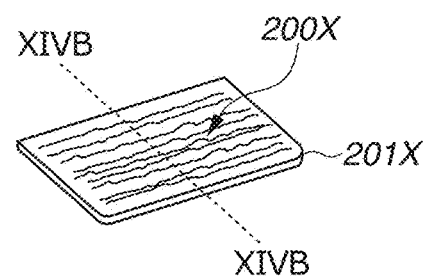
FIGS. 14A, 14B, 14C, and 14D are a perspective view of a resin molded product, a cross-sectional view of the resin molded product taken along the line XIVB-XIVB of FIG. 14A, a plan view of a hairline pattern of the resin molded product, and a plan view schematically illustrating the hairline pattern on a surface of the resin molded product according to a comparative example 1, respectively.
Figure 14B:
Figure 14C:
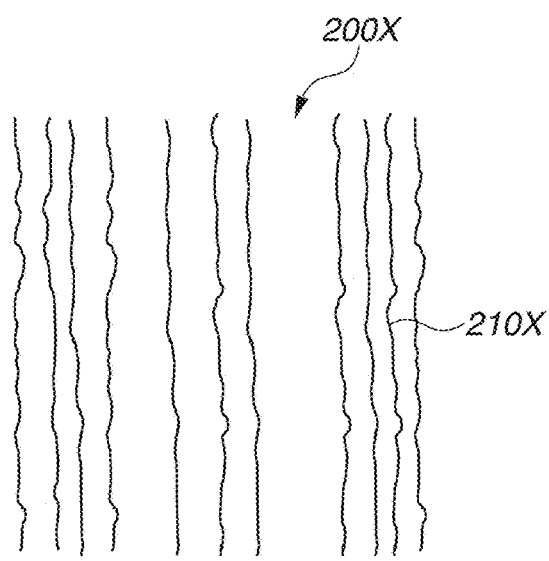
Figure 14D:
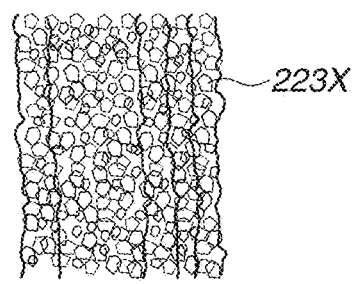

FIG. 14A is a perspective view of the resin molded product according to the comparative example 1. A hairline pattern 200X was transferred to a resin molded product 201X according to the comparative example 1. FIG. 14B is a cross-sectional view of the resin molded product taken along the line XIVB-XIVB of FIG. 14A. Concave portions 221X in FIG. 14B are transferred portions that were masked by the masking sheet, and convex portions 222X are transferred portions that were not masked by the masking sheet. FIG. 14C is a plan view of the hairline pattern of the resin molded product. The boundary lines between the concave portions 221X and the convex portions 222X are hairlines 210X extending vertically in FIG. 14C. The hairlines 210X are inferior in linearity to the hairlines formed by cutting due to the effect of etching. FIG. 14D is a plan view schematically illustrating the hairline pattern on the surface of the resin molded product according to the comparative example 1. The effect of etching roughened the mold surface, and as a result, concave and convex 223X appear on the entire surface.

Figure 16:
FIG. 16 illustrates a micrograph of the resin molded product according to the comparative example 1.

FIG. 15 is a graph illustrating shape data in the X direction of the hairline pattern of the resin molded product according to the comparative example 1. The horizontal axis illustrated in FIG. 15 is a measurement position [mm] in the X direction and the vertical axis is a shape height [µm]. FIG. 16 illustrates a micrograph of the resin molded product according to the comparative example 1. From FIGS. 15 and 16, in the resin molded product according to the comparative example 1, concave and convex appear on the entire surface, the surface is roughened, and the hairlines have low linearity. As a result, as illustrated in FIG. 9, Ry is as high as 7.05 [µm], and Spc is as high as 1375 [1/mm], and thus the roughness is large. In addition, the gloss is as low as 7 [GU].

As described above, in the resin molded product according to the comparative example 1, deterioration of the hairlines and roughness of the surface due to concave and convex leads to irregular reflection of light. Thus, the resin molded product has low gloss and degraded high-class feeling.

Figure 10:
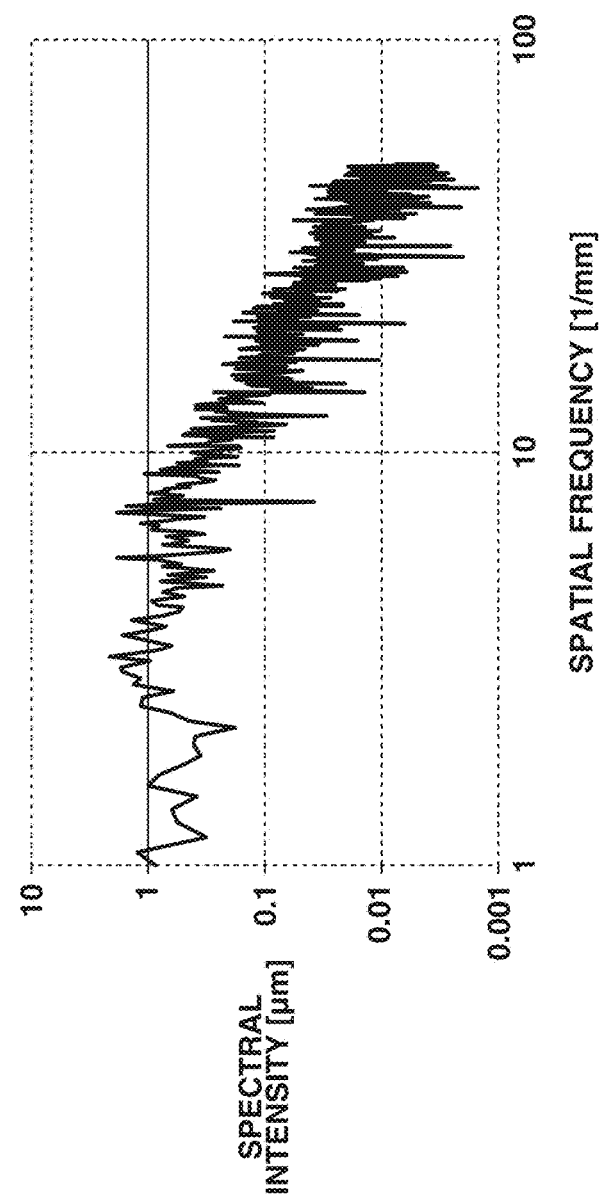
FIG. 10 is a graph of a spectral intensity with respect to a spatial frequency according to Example 8.

On the other hand, FIG. 10 is a graph of the spectral intensity with respect to the spatial frequency according to the example 8. In FIG. 10, the horizontal axis represents the spatial frequency and the vertical axis represents the spectral intensity. Both the vertical and horizontal axes are represented by logarithms. As illustrated in FIG. 10, the spectral intensity is inversely proportional to the spatial frequency f, that is, 1/f type. Although not illustrated, the same tendency as the example 8 was observed in the examples 1 to 7. Since the spectral intensity is 1/f type as described above, high-class feeling is enhanced.

Figure 11:
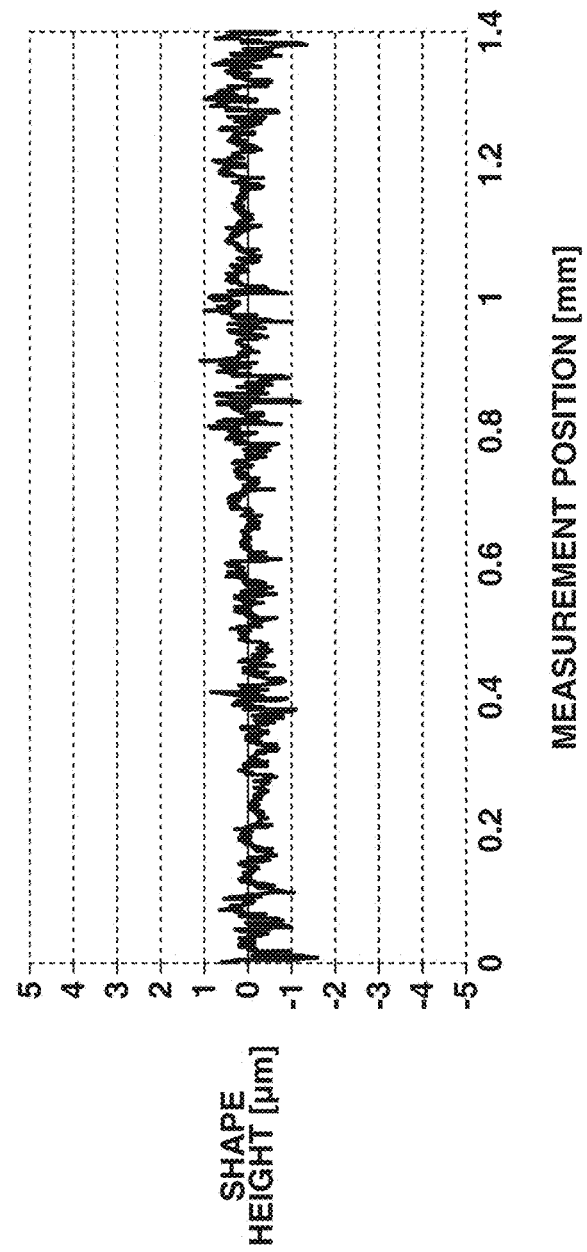
FIG. 11 is a graph illustrating shape data in an X direction of a hairline pattern of a resin molded product according to Example 8.

FIG. 11 is a graph illustrating shape data in the X direction of the hairline pattern of the resin molded product according to the example 8. The horizontal axis illustrated in FIG. 11 is a measurement position [mm] in the X direction and the vertical axis is a shape height [µm]. From the comparison between FIG. 11 and FIG. 15, the resin molded product according to the example 8 has lower surface roughness than the resin molded product according to the comparative example 1.

Figure 12:
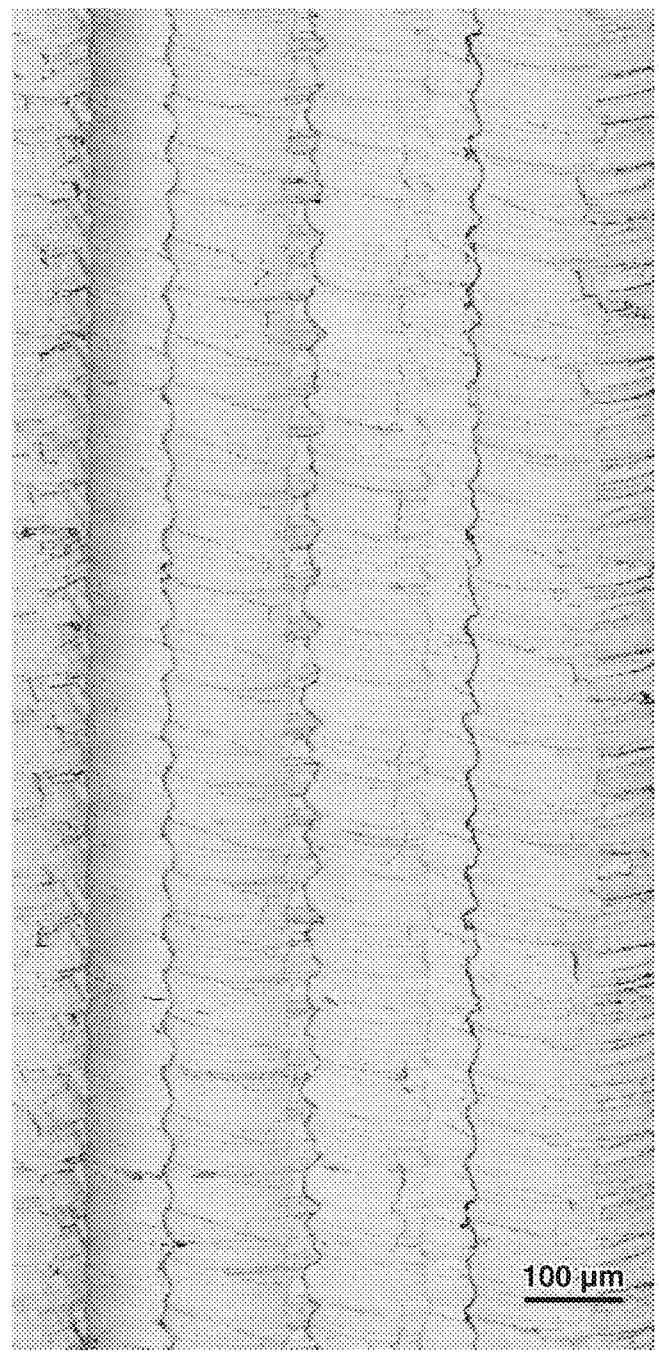
FIG. 12 illustrates a micrograph of the resin molded product according to Example 8.

FIG. 12 illustrates a micrograph of the resin molded product according to the example 8. The resin molded product according to the example 8 illustrated in FIG. 12 has less concave and convex, and hairlines having higher linearity than that of the comparative example 1. As a result, as illustrated in FIG. 9, Ry is as low as 2.6 [µm], and Spc is as low as 375 [1/mm], and the roughness is small. In addition, the gloss is as high as 26 [GU]. From these results, it can be seen that on the resin molded product 201 of this example, the hairline pattern 200 having high quality and presenting high-class feeling is formed.

That is, as illustrated in FIG. 9, the hairline pattern 200 has the maximum height Ry in the X direction of 6 [µm] or less and the arithmetic average curvature Spc of the apex points of 625 [1/mm] or less, and thus the roughness is reduced, and the gloss is high. More specifically, the gloss is 8 [GU] or higher. As a result, the high-class feeling of the resin molded product 201 and then that of the electronic device 100 is enhanced.

From FIG. 9, when the maximum height Ry is 5 [µm] or less and the arithmetic average curvature Spc of the apex points is 500 [1/mm] or less, the roughness is further reduced and the gloss is even higher. More specifically, the gloss is 10 [GU] or higher. This further enhances the high-class feeling of the resin molded product 201, that is, the electronic device 100.

From FIG. 9, it is preferable that the height difference ΔT21 between the apex points of the ridges 221 and the apex points of the ridges 222 is 3 [µm] or more and 53 [µm] or less. In other words, it is preferable that the apex points of the ridges 222 is higher than the apex points of the ridges 221 by a value within a range between 3 [µm] and 53 [µm] inclusive. When the height difference is 3 [µm] or less, large noise is caused against 1/f fluctuation. On the other hand, when the height difference exceeds 53 [µm], concave and convex are too large to provide uniform gloss. From FIG. 9, it is more preferable that the difference ΔT21 is 5 [µm] or more and 50 [µm] or less.

It should be noted that the present disclosure is not limited to the exemplary embodiments described above, and many modifications are possible within the technical concept of the present disclosure. In addition, the effects described in the exemplary embodiments are merely provided as the most preferable effects produced by the present disclosure, and the effects of the present disclosure are not limited to those described in the exemplary embodiment.

OTHER EMBODIMENTS

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-164832, filed Aug. 25, 2016, which is hereby incorporated by reference herein in its entirety.

What is claimed is:

1. A resin molded product comprising a surface having a hairline pattern in which a plurality of ridges extending in one direction is arranged in a width direction orthogonal to the one direction, wherein the plurality of ridges includes a plurality of first ridges and a plurality of second ridges higher than the first ridges, and wherein the hairline pattern has a maximum height Ry of 6 [μm] or less in the one direction, and has an arithmetic average curvature Spc of apex points of 625 [1/mm] or lower.

2. The resin molded product according to claim 1, wherein the maximum height Ry is 5 [μm] or less and the arithmetic average curvature Spc is 500 [1/mm] or lower.

3. The resin molded product according to claim 1, wherein apex points of the second ridges are higher than apex points of the first ridges by a range of 3 [μm] and more and 53 [μm] or less.

4. The resin molded product according to claim 1, wherein a spectral intensity of surface roughness in the width direction of the hairline pattern is a 1/f type that is inversely proportional to spatial frequency f.

5. The resin molded product according to claim 1, wherein the first and second ridges are formed to have an arc shape in a cross section in the width direction.

6. The resin molded product according to claim 5, wherein the first and second ridges are formed to have a plurality of balls having an identical radius of curvature consecutively arranged in the one direction overlapping each other.

7. An electronic device comprising an exterior member comprising a surface having a hairline pattern in which a plurality of ridges extending in one direction is arranged in a width direction orthogonal to the one direction, wherein the plurality of ridges includes a plurality of first ridges and a plurality of second ridges higher than the first ridges, and wherein the hairline pattern has a maximum height Ry of 6 [μm] or less in the one direction, and has an arithmetic average curvature Spc of apex points of 625 [1/mm] or lower.

* * * * *